US010356930B2

(12) United States Patent
Schulze et al.

(10) Patent No.: US 10,356,930 B2
(45) Date of Patent: Jul. 16, 2019

(54) ADAPTER ASSEMBLIES

(71) Applicant: Hewlett Packard Enterprise Development LP, Houston, TX (US)

(72) Inventors: James Jeffrey Schulze, Houston, TX (US); Jeoff M. Krontz, Tomball, TX (US); James Dupuy, Jr., Houston, TX (US); Richard J. Tomaszewski, Houston, TX (US); James Kenneth Yates, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/562,094

(22) PCT Filed: Apr. 24, 2015

(86) PCT No.: PCT/US2015/027592
§ 371 (c)(1),
(2) Date: Sep. 27, 2017

(87) PCT Pub. No.: WO2016/171729
PCT Pub. Date: Oct. 27, 2016

(65) Prior Publication Data
US 2018/0077815 A1    Mar. 15, 2018

(51) Int. Cl.
*G06F 1/18*    (2006.01)
*H05K 1/14*    (2006.01)
*H05K 7/14*    (2006.01)
*H05K 7/02*    (2006.01)
*H05K 7/18*    (2006.01)

(52) U.S. Cl.
CPC .......... *H05K 7/1487* (2013.01); *H05K 7/023* (2013.01); *H05K 7/1425* (2013.01); *H05K 7/18* (2013.01); *G06F 1/185* (2013.01); *G06F 1/186* (2013.01); *H05K 1/14* (2013.01)

(58) Field of Classification Search
CPC .......... G06F 1/185; G06F 1/186; G06F 1/187; H05K 1/14; H05K 7/1487; H05K 7/023; H05K 7/1425; H05K 7/18
USPC .......... 361/752, 759, 810, 679.32, 788, 801, 361/807; 439/65; 211/41.12
See application file for complete search history.

(56) References Cited

U.S. PATENT DOCUMENTS

| | | |
|---|---|---|
| 5,726,922 A | 3/1998 | Womble et al. |
| 5,926,378 A | 7/1999 | DeWitt et al. |
| 5,961,618 A | 10/1999 | Kim |
| 6,046,912 A | 4/2000 | Leman |

(Continued)

OTHER PUBLICATIONS

M. Tom, Spreading Our Wings, (Web Page), Retrieved Feb. 20, 2015, 27 Pages, http://cloudreviewhq.com/tag/micro-tower/.

(Continued)

*Primary Examiner* — Abhishek M Rathod
(74) *Attorney, Agent, or Firm* — Hewlett Packard Enterprise Patent Department (57) ABSTRACT

An example adapter assembly may comprise an adapter cage to removably mount to a riser board of a computer system. Further, the example adapter assembly may comprise an adapter board disposed on the adapter cage, wherein the adapter cage is to receive multiple computer components, and the adapter board is to engage with the multiple computer components.

25 Claims, 6 Drawing Sheets

(56) References Cited

U.S. PATENT DOCUMENTS

| | | | |
|---|---|---|---|
| 6,118,668 A * | 9/2000 | Scholder | G06F 1/184 |
| | | | 361/679.32 |
| 6,533,587 B1 | 3/2003 | Potter et al. | |
| 6,731,515 B2 | 5/2004 | Rhoads | |
| 6,754,084 B1 | 6/2004 | Bolognia et al. | |
| 7,075,797 B1 | 7/2006 | Leonard et al. | |
| 7,359,216 B2 * | 4/2008 | Hall | G06F 1/185 |
| | | | 361/679.55 |
| 7,433,198 B2 * | 10/2008 | Fan | G06F 1/181 |
| | | | 361/679.01 |
| 7,443,696 B2 | 10/2008 | Lin et al. | |
| 7,645,144 B2 | 1/2010 | Tzeng et al. | |
| 8,054,642 B2 * | 11/2011 | Liu | G06F 1/185 |
| | | | 361/759 |
| 8,369,102 B2 | 2/2013 | Tsai et al. | |
| 8,737,054 B2 * | 5/2014 | Zhou | G06F 1/185 |
| | | | 361/679.32 |
| 9,214,745 B1 * | 12/2015 | Li | G11B 33/128 |
| 2007/0144983 A1 * | 6/2007 | Fan | H05K 7/1424 |
| | | | 211/26 |
| 2008/0298030 A1 * | 12/2008 | Fan | G06F 1/185 |
| | | | 361/759 |
| 2010/0002369 A1 * | 1/2010 | Lee | G06F 1/181 |
| | | | 361/679.33 |
| 2010/0254096 A1 | 10/2010 | Kim | |
| 2010/0254100 A1 * | 10/2010 | Kim | H05K 7/1461 |
| | | | 361/752 |
| 2011/0317342 A1 * | 12/2011 | Li | G06F 1/185 |
| | | | 361/679.01 |
| 2012/0021624 A1 * | 1/2012 | Tuma | G06F 1/185 |
| | | | 439/76.1 |
| 2012/0281373 A1 * | 11/2012 | Bohannon | H05K 7/1489 |
| | | | 361/756 |
| 2013/0180935 A1 * | 7/2013 | Lee | G11B 33/128 |
| | | | 211/41.12 |
| 2015/0115120 A1 * | 4/2015 | Yu | H05K 7/1487 |
| | | | 248/288.11 |

OTHER PUBLICATIONS

EPO, Extended European Search Report, dated Sep. 20, 2018. Application No. 15890128.0, 8 pages.
PCT/ISA/KR, International Search Report and Written Opinion, dated Jan. 22, 2016, PCT/US2015/027592, 12 pages.

* cited by examiner

ADAPTER ASSEMBLIES

BACKGROUND

Computer systems, including server systems, can have main system boards. System boards can include computer system components, including expansion connectors, sometimes referred to as expansion slots. Computer expansion slots can interface and engage with various computer or expansion components that a user may want to connect to the computer system in order to enhance the performance or capabilities of the computer system. Some expansion components may engage with an expansion slot of a computer system through a riser board. Riser boards may include expansion slots to engage with expansion components. A riser board may allow an expansion component to be engaged with the computer system in a more compact configuration.

DETAILED DESCRIPTION

Computer systems, including server systems, may include main system boards that engage with various computer components. The system board may engage with computer components through the use of expansion connectors or slots on the system board. The computer components may include edge connectors with multiple contacts, pads, or pins, e.g., gold finger connectors, to interface with such expansion slots. Expansion slots can engage with computer components in order to enhance the performance or capabilities of the computer system. Expansion slots may use an expansion bus of the computer system to connect computer components to the main system bus of the computer system for the transfer of data. Expansion slots may include Peripheral Component Interconnect (PCI) slots, Accelerated Graphics Port (AGP) slots, Peripheral Component Interconnect Express (PCIe) slots, or other computer bus standard slots. In some situations, the computer components may engage with the expansion slots through riser boards.

Riser boards may be used to engage computer components with expansion slots of the computer system. A riser board may engage with an expansion slot using an edge connector, which may insert into the slot in a manner that may be perpendicular to the system board. A riser board may also include one or more expansion slots of its own such that one or more computer components may engage with the riser board through the expansion slots, and, further, insert in a manner that is perpendicular to the riser board. Riser boards may, therefore, allow computer components to engage with expansion slots of the system board while the expansion components are disposed above the system board in a more compact configuration than if each expansion component was insertably engaged with an expansion slot of the system hoard directly.

Computer systems may also engage with storage drives for the storage of data. The computer systems may engage with storage drives through the use of dedicated storage drive bays. Additionally, the computer system may engage with such storage drives through expansion slots, as described above. Such storage drives, in some situations, may be supplementary storage drives for the backing-up of data, or for increasing the storage density of a computer system, including server systems. Further, such a storage drive may be used as a boot drive for the configuration of the computer system. In some situations, such supplementary storage drives may be an upgrade option for the computer system, and the computer system may have a dedicated area within it for the location of the storage drives of such an upgrade option. In the event that the computer system is employed without the upgrade option installed, the dedicated area within the computer system may be left empty, effectively wasting that internal volumetric space. It may be desirable in some computer systems, such as server systems, to avoid wasting internal space within the system, yet to still offer an upgrade option that will allow a user to increase the storage capacity or density of the system for a variety of reasons.

Additionally, such an upgrade option may require the disassembly or opening of the computer system to install, remove, or troubleshoot the storage drive or drives therein. In some situations, it may be desirable to employ such an upgrade option where the storage drives are hot-pluggable, instead. Here, hot-pluggable may refer to the ability of the storage drives to be inserted or removed from the computer system without the need to shut the computer system down and without risking a loss of data of the storage drives. In order to make the storage drive or drives of such an upgrade option hot-pluggable, it may be necessary to replace or redesign an entire panel or side of the computer system for variations of the system that will include the hot-pluggable upgrade option.

Further, expansion slots may be employed in a computer system to engage an upgrade option with the computer system. In some situations, expansion components other than storage drives may be available as such an upgrade option. In the event that the computer system is employed without the upgrade option installed, the expansion slot may not be used, therefore, effectively wasting the volumetric space within the computer system that is around the expansion slot.

Implementations of the present disclosure provide an adapter assembly that can mount within an existing computer system and provide additional computer or expansion components or storage drives for the system. The present disclosure may further provide an adapter assembly that can enable hot-pluggable storage drives to be implemented within an existing computer system without replacing or redesigning significant structural components of the system. Further, the provided adapter assemblies may utilize unused space above or around empty expansion slots within the computer system to provide volumetric space for an upgrade option for a user.

Figure 1A:
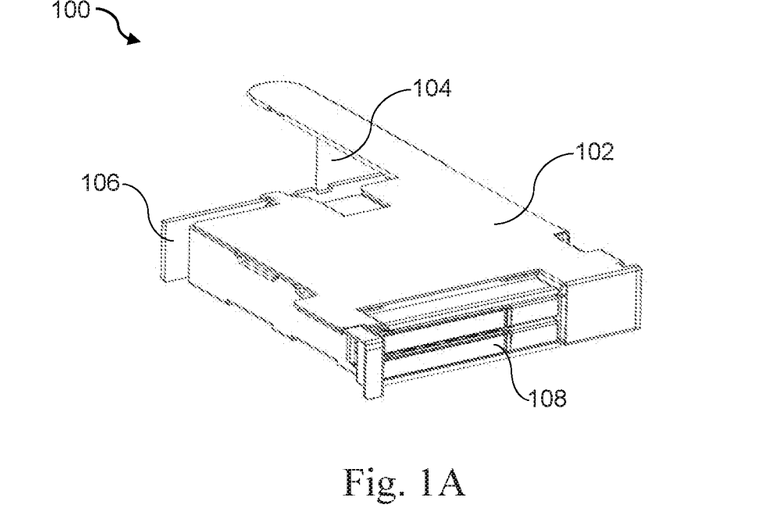
FIG. 1A is a perspective view of an example adapter assembly.

Referring now to FIG. 1A, a perspective view of an example adapter assembly 100 is illustrated. The adapter assembly 100 may comprise an adapter cage 102 and an adapter board 106 disposed on or within the adapter cage 102. The adapter cage 102 may be a rigid or semi-rigid structural component that may engage with other structural components of a computer system. In some implementations, the adapter cage 102 may comprise a rectangular geometry or cross-section. In further implementations, the adapter cage 102 may comprise a different geometry or cross-section. In some implementations, the adapter cage 102 may be constructed such that the cage 102 protects computer components disposed within the cage from static or electrical interference, or from physical contact, shock, vibration, or other potentially damaging occurrences. In some implementations, the adapter cage 102 may comprise a metallic material, such as steel or aluminum. In further implementations, the adapter cage may comprise sheet metal which may be formed by stamping, folding, pressing, or other manufacturing processes. In yet further implementations, the adapter cage may comprise a polymer material, such as molded or machined plastic.

The adapter cage 102 may engage with one or more, or multiple computer components 108 and a computer system such that the computer components 108 are removably fixed within the computer system through their engagement with the adapter cage 102. In some implementations, the computer components 108 may be partially or wholly disposed within the adapter cage 102. In further implementations, the adapter cage 102 may removably receive the computer components 108 within an opening in the adapter cage. In yet further implementations, the adapter cage 102 may receive the computer components 108 in a stacked fashion, or slidably receive the computer components 108 in a stacked fashion. A stacked fashion may refer to the orientation of the computer components 108 relative to each other and, further, may mean that the computer components 108 are arranged substantially parallel to each other. Moreover, the adapter cage 102 may receive the multiple computer components 108 in a stacked fashion such that they are arranged substantially perpendicular to the adapter board 106 and a riser board of the computer system. The adapter cage 102 may, in some implementations, removably receive each of the one or more computer components 108 individually from each other. In other words, each computer component 108 may be inserted into or removed from the adapter cage 102 separately from any other computer component 108 that may be engaged with the adapter cage 102.

Figure 1B:
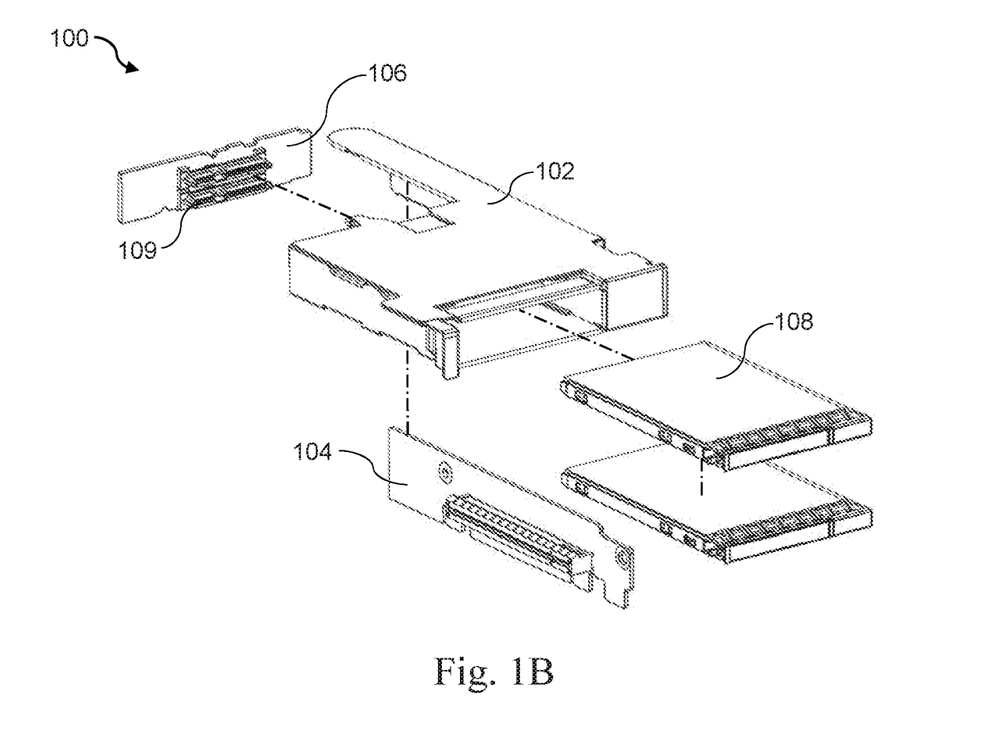
FIG. 1B is a perspective exploded view of an example adapter assembly.

Referring additionally to FIG. 1B, a perspective exploded view of an example adapter assembly 100 is illustrated. The adapter cage 102 may engage with a computer system by mechanically engaging with a structural component of the computer system, such as an exterior panel, case, rack, enclosure, or interior bay or support. Further, the adapter cage 102 may also mechanically engage with a non-structural component of the computer system, such as a system board or a riser board 104 of the computer system that may be engaged with the system board. The riser board 104 may be engaged with an expansion slot on the system board of the computer system. In some implementations, the adapter cage 102 may removably engage with an existing riser board 104 disposed within the computer system. In further implementations, the adapter cage 102 may removably fix the computer components 108 relative to the computer system, the riser board 104 therein, or any structural components of the computer system that the adapter cage 102 may be engaged with.

The example adapter assembly 100 may further comprise an adapter board 106 disposed on the adapter cage 102. The adapter board 106 may structurally support and electrically connect multiple electronic components. The adapter board 106 may, in some implementations, connect multiple electronic components with conductive pathways, which, in further implementations, may include copper. In yet further implementations, the adapter board 106 may be made, at least partially, out of a non-conductive substrate with copper pathways etched onto the substrate. In some implementations, the non-conductive substrate may include silicone. In further implementations, the adapter board 106 might comprise a single-layer printed circuit board (PCB), or a multi-layer PCB in other implementations.

The adapter board 106 may be disposed on or within the adapter cage 102, in some implementations, such that the adapter cage 102 fixes the adapter board 106 in position within the computer system. In this context, disposed on or within the adapter cage may refer to the adapter board 106 being positioned on the outside or partially or wholly within the adapter cage 102. The adapter board 106 may further be fixed by the adapter cage 102 relative to the computer system, the riser board 104 therein, or any structural components of the computer system that the adapter cage 102 may be engaged with. In some implementations, the adapter board 106 may operably engage with the one or more, or multiple computer components 108. In some implementations, the adapter board 106 may operably engage with the computer components 108 through electrical connectors 109, which may be disposed on the adapter board 106. The adapter cage 102 may align the computer components 108 with the adapter board 106 such that they may engage with the adapter board 106 through the electrical connectors 109. Further, the computer components 108 may engage with and electrically communicate with the computer system through the adapter board 106. The adapter board 106 may facilitate electrical communication between the computer components 108 and the computer system through cabling or other connectors from the adapter board 106 to the computer system. In some implementations, the computer components 108 only electrically communicate with the computer system through the adapter board 106. The adapter board 106 may also provide power to the computer components 108. To accomplish this, the adapter board 106 may receive power from the computer system through the riser board 104. In some implementations, the adapter board 106 may receive power from the computer system from a different riser board or another portion of the computer system. The riser board 106 may then provide the received power to the computer components 108 through the electrical connectors 109.

The electrical connectors 109 may be disposed on the adapter board 106 such that they are engaged with the conductive pathways of the adapter board 106. The electrical connectors 109 may each be electrical interfaces to engage with a complementary electrical connector or edge connector. In some implementations, the electrical connectors 109 may each engage with a complementary electrical connector comprising multiple pins. In some implementations, the electrical connectors 109 may comprise sockets, or female connectors to each engage with a complementary male connector. In further implementations, the electrical connectors 109 may each be an electrical interface to removably engage with a complementary storage drive interface in a hot-pluggable fashion. In yet further implementations, the electrical connectors 109 may each be a Serial Attached Small Computer System Interface (SAS) connector. In further implementations, the electrical connectors 109 may each be 29-pin SAS connectors.

The one or more computer components 108 may be components that increase the performance or capabilities of the computer system. In some implementations, the computer components may be expansion components that may engage with an expansion bus of the computer system. In further implementations, the computer components 108 may be storage drives for storing data of the computer system. In further implementations, the one or more, or multiple computer components 108 may be two storage drives of the same form factor. In yet further implementations, the storage drives may be hard disk drives (HDD's). In some implementations the storage drives may be solid state drives (SSD's). In further implementations, the storage drives may be optical storage drives, or comprise flash memory. In some implementations, the storage drives may be Small Form Factor (SFF) storage drives, and in further implementations, the storage drives may be 7 millimeter (mm) SFF storage drives.

Figure 2A:
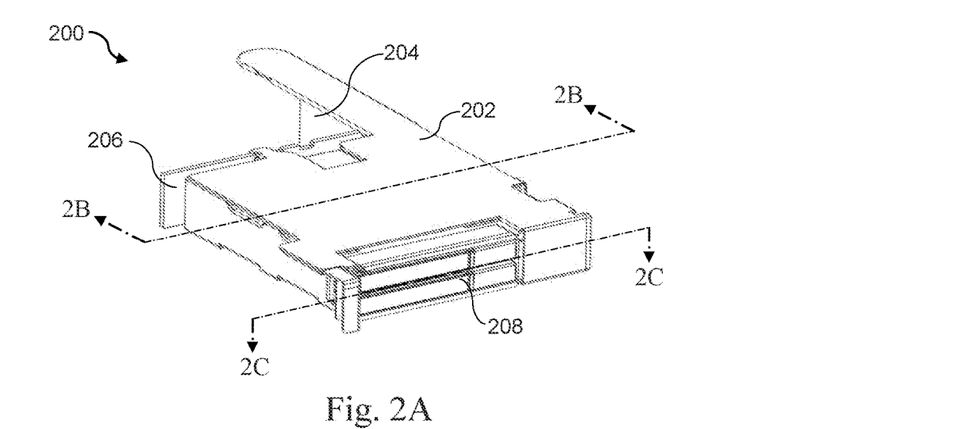
FIG. 2A is a perspective view of an example adapter assembly, including cut lines 2B and 2C.
Figure 2B:
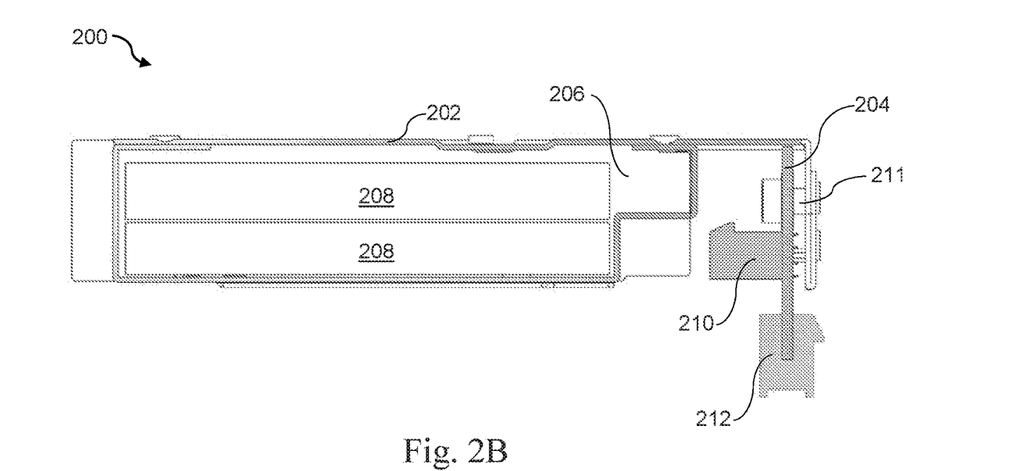
FIG. 2B is a front cross-sectional view of an example adapter assembly, taken along cut line 2B.

Referring now to FIGS. 2A and 2B, a perspective view of an example adapter assembly 200 is illustrated, as well as a front cross-sectional view of the example adapter assembly. Adapter assembly 200 may be similar to adapter assembly 100. Further, the similarly named elements of adapter assembly 200 may be similar in function and/or structure to the elements of adapter assembly 100, as they are described above. Adapter assembly 200 may include an adapter cage 202 to receive one or more computer components 208, and an adapter board 206 to engage with the computer components 208. The example adapter assembly 200 may further comprise a riser board 204 to engage with a computer system. The riser board 204 may be an existing riser board within the computer system. The riser board 204 may structurally support and electrically connect multiple electronic components. The riser board 204 may, in some implementations, connect multiple electronic components with conductive pathways, which, in further implementations, may include copper. In yet further implementations, the riser board 204 may be made, at least partially, out of a non-conductive substrate with copper pathways etched onto the substrate. In some implementations, the non-conductive substrate may include silicon. In further implementations, the riser board 102 might comprise a single-layer printed circuit board (PCB), or a multi-layer PCB in other implementations.

The riser board 204 may include an edge connector, which may include multiple pins, including signal pins, power pins, and ground pins. The multiple pins may be operably engaged with the conductive pathways of the riser board 204. The multiple pins may be to engage with complementary receptacle pins in an expansion slot 212 of the computer system such that the riser board 204 is operably engaged with such an expansion slot 212 and, thus, the computer system itself. In some implementations, the expansion slot 212 may be disposed on the system board of the computer system. The edge connector may engage with the expansion slot 212 by being inserted into the slot from a direction parallel to the slot opening and, therefore, substantially perpendicular to the system board. The edge connector may facilitate electrical communication via one or more signal paths between the riser board 204 and the expansion slot and, thus, an expansion bus and main system bus of the computer system. In some implementations, the expansion slot may be a Peripheral Component Interconnect (PCI) slot, or a PCI Express (PCIe) expansion slot.

In some implementations, the riser board 204 may, at least partially, structurally engage the adapter assembly 200 with the computer system. This may be accomplished by the adapter cage 202 removably mounting to the riser board 204. In further implementations, the adapter assembly 200 may be further structurally engaged with the computer system through attachment to other components of the computer system, such as a portion of a panel, case, or support. In some implementations, the adapter assembly 200 may removably mount or attach to the riser board 204 through mechanical fasteners such as the example mechanical fastener 211. The riser board 200 may be an existing riser board of the computer system, and, as such, the riser board 204 may comprise an expansion slot 210 disposed on the riser board 204. Expansion slot 210 may be similar in function and/or structure to expansion slot 212, in some implementations, and the riser board 204 may electrically engage the expansion slot 210 with the expansion slot 212. The expansion slot 210 may be to receive and engage with an expansion component of the computer system and engage the expansion component with the computer system.

In some implementations, when engaged with the expansion slot 210, an expansion component of the computer system may occupy part of or the whole volumetric area of the computer system that the adapter assembly 200 would occupy if the adapter assembly 200 was engaged with the computer system through the riser board 204. Therefore, the expansion slot 212 may be unable to receive and engage with the expansion component while the adapter cage 202 is mounted to the riser board 204. In further implementations, the riser board 204 may be able to engage the adapter assembly 200 with the computer system in a first layout, while the expansion slot 210 of the riser board 204 may be able to receive and engage with an expansion component of the computer system in a second layout. In yet further implementations, the riser board 204 may not be able to be in the first layout and the second layout at the same time. In other words, the riser board 204 may not be able to structurally engage the adapter assembly 200 with the computer system if the expansion slot 210 of the riser board 204 is currently engaged with an expansion component of the computer system, and vice versa. In further implementations, the riser board 204 may still be able to structurally engage the adapter assembly 200 with the computer system when the expansion slot 210 of the riser board 204 is currently engaged with an expansion component that has a relatively low profile. In yet further implementations, the computer components 208 do not electrically engage with the expansion slot 210.

In some implementations, the second layout may represent a regular or default version of the computer system, while the first layout may represent the computer system being equipped with an upgrade option, wherein the adapter assembly 200 is the upgrade. In further implementations, the first layout may be able to be employed without a significant change to the computer system, other than the removal or absence of the expansion component that would normally be engaged with expansion slot 210. In this context, significant change to the computer system may include changes such as using a different riser board to engage with the adapter assembly 200, modifying or changing an exterior panel or case of the computer system, or changes to the system board specifically to employ the adapter assembly 200.

Figure 2C:
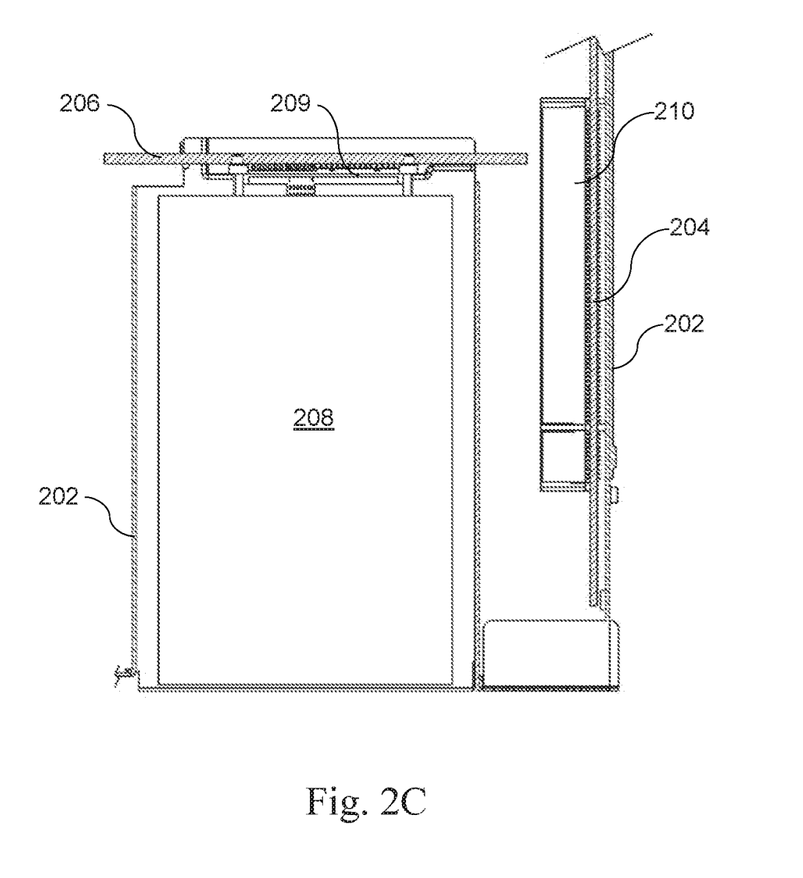
FIG. 2C is a top cross-sectional view of an example adapter assembly, taken along cut line 2C.

Referring still to FIG. 2B, and additionally to FIG. 2C, front and top cross-sectional views of an example adapter assembly 200 are illustrated. The adapter board 206 may be attached to or disposed on the adapter cage 202 such that the adapter board 206 is located in front of the expansion slot 210 when the adapter cage 202 is mounted to the riser hoard 204, as illustrated in FIG. 2B. In this context, the adapter board 206 located in front of the expansion slot 210 may refer to the adapter board 206 being disposed in front of or over the portion of the slot 210 that is to engage with the edge connector of an expansion component. In some implementations, the adapter board 206 may be located along the expansion slot 210 of the riser board 204 when the adapter cage 202 is mounted to the riser hoard 204, as illustrated in FIG. 2C. Therefore, the adapter board 206 may, in some implementations, prevent the edge connector of an expansion component from being inserted and engaged with the expansion slot 210.

In further implementations, the adapter board 206 may comprise one or more electrical connectors 209 to engage with the computer components 208. The electrical connectors 209 may be disposed on the adapter board 206 and the adapter cage 202 may receive the computer components 208 such that, when engaged with the adapter cage 202 and the electrical connectors 209, the computer components 208 are located in front of the expansion slot 210, as illustrated in FIG. 2B, and/or along the expansion slot 210, as illustrated in FIG. 2C. Therefore, in some implementations, when engaged with the one or more electrical connectors 209, the computer components 208 may prevent the edge connector of an expansion component from being inserted into and engaged with the expansion slot 210. In further implementations, the computer components 208, when engaged with the electrical connectors 209, may occupy at least part of the volumetric area that would otherwise be occupied by an expansion component, should the expansion slot 210 be engaged with such an expansion component.

Figure 3A:
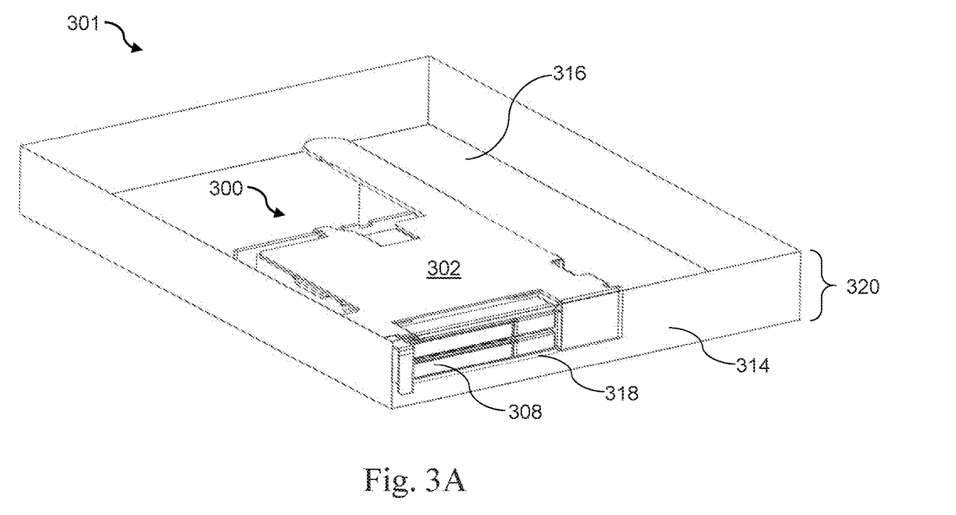
FIG. 3A is a perspective view of a computer system including an example adapter assembly.

Referring now to FIG. 3A, a perspective view of a computer system 301 comprising an example adapter assembly 300 is illustrated. Adapter assembly 300 may be similar to adapter assembly 100 or 200. Further, the similarly named elements of adapter assembly 300 may be similar in function and/or structure to the elements of adapter assembly 100 or 200, as they are described above. Adapter assembly 300 may be disposed within the computer system 301. In some implementations, the computer system 301 may be a server system to engage with a server rack or enclosure. In some implementations, the server system may be to engage with a 19-inch or a 23-inch server rack. In further implementations, the height 320 of the computer system 301 may be in increments of standard rack unit (U) heights. In yet further implementations, the computer system 301 may be a 1 U height server system to engage with a server rack or enclosure, and the adapter assembly 300 is to fit within the 1 U height server. In other words, the computer system may have a height 320 that is sufficiently sized to allow the computer system to be engaged with a server enclosure that can receive a 1 U height server system.

The adapter assembly 300 may, in some implementations, be disposed against an opening 318 of panel 314 of the computer system 301. The panel 314 may be a structural component of the computer system 301, in some implementations. In further implementations, the panel 314 may be an exterior panel, case, or wall of the computer system. In this context, exterior panel may refer to a panel that is on the exterior of the discreet computer system 301, and not necessarily on the exterior of any supplemental enclosure, rack, or system that the computer system 301 may be engaged with or inserted into. The exterior panel may, actually, be on the interior of any such supplemental system when the computer system 301 is engaged with or inserted into the supplemental system. The panel 314 of the computer system 301 may have an opening or bay 318 against which the adapter assembly 300 is disposed. An adapter cage 302 of the adapter assembly 300, in some implementations, may receive one or more computer components 308 such that they are aligned with and engage with an adapter board 306. The adapter cage 302 may receive the computer components 308 through the opening or bay 318 in the panel 314 of the computer system 301. The adapter cage 302 may be disposed against the exterior panel's opening or bay 318 such that each computer component 308 may be individually inserted or removed from the adapter cage 302, and, thus, the adapter assembly 300. Further, each computer component 308, in some implementations, may be hot-plugged, or inserted and removed in a hot-pluggable fashion, into the computer system 301 through the opening or bay 318.

Figure 3B:
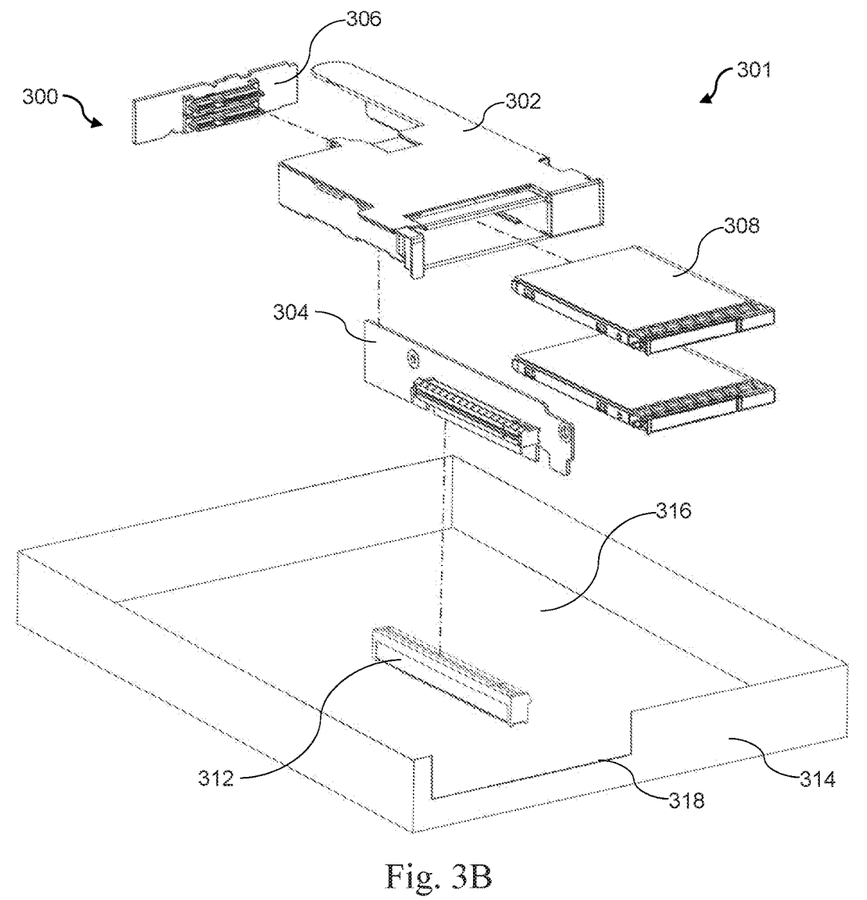
FIG. 3B is a perspective exploded view of a computer system including an example adapter assembly.

Referring additionally to FIG. 3B, a perspective exploded view of a computer system 301 comprising an example adapter assembly 300 is illustrated. The computer system 301 may comprise a system board 316 within the computer system 301, and the example adapter assembly 300 may, in some implementations, operably engage with the computer system 301 by engaging with the system board 316. Further, the system board 316 may comprise an expansion slot 312. The expansion slot 312, in some implementations, may be similar in structure and/or function to expansion slots 210 or 212. The example adapter assembly 300 may include a riser board 304 having an edge connector. The adapter assembly 300 may, therefore, engage with the expansion slot 312 of the system board 316 by the edge connector of the riser board 304 engaging with the expansion slot 312 of the system board 316.

Figure 4A:
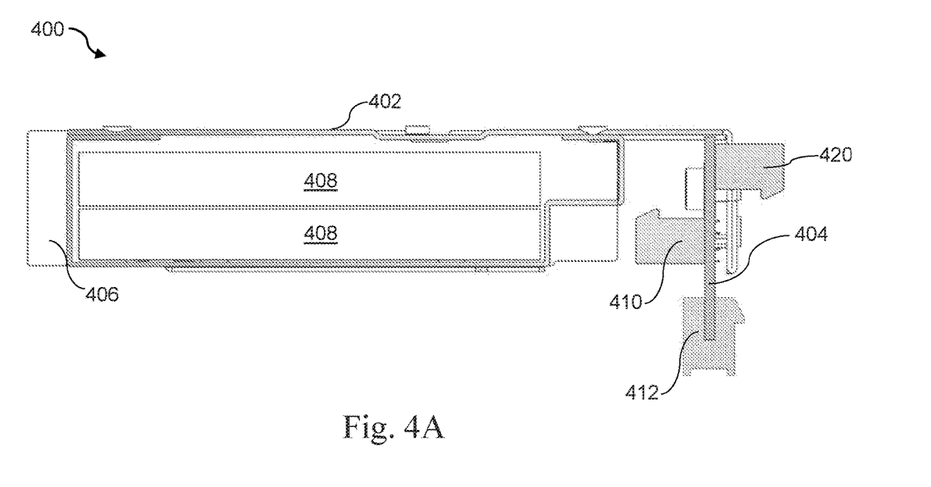
FIG. 4A is a front cross-sectional view of an example adapter assembly.

Referring now to FIG. 4A, a front cross-sectional view of an example adapter assembly 400 is illustrated. Adapter assembly 400 may be similar to adapter assembly 100, 200 or 300. Further, the similarly named elements of adapter assembly 400 may be similar in function and/or structure to the elements of the above-described adapter assemblies, as they are described above. The adapter assembly 400 may include a riser board 404. The riser board 404 may include a first expansion slot 410. In some implementations, the expansion slot 410 may be similar to expansion slots 210, 212, or 312, or any above-described expansion slot. Additionally, adapter assembly 400 may comprise a second expansion slot 420. Expansion slot 420 may also be similar to any of the above-described expansion slots. The first and second expansion slots 410 and 420, respectively, may be disposed on the riser board 404 such that they are operably engaged with the riser board 404. In other words, the first and second riser boards 410 and 420 may be engaged with electrically conductive pathways of the riser board 404 which, in turn, may be engaged with an edge connector of the riser board 404. In some implementations, the first expansion slot 410 may be disposed on a first side of the riser board 404. In further implementations, the second riser board 420 may be disposed on a second side of the riser board 404. In yet further implementations, the first side and the second side of the riser board may be opposing sides of the riser board 404.

Referring still to FIG. 4A, the adapter assembly 400 may further include an adapter cage 402 to receive one or more computer components 408. The adapter cage 402 may receive the computer components 408 and align them such that they may engage with an adapter board 406 of the adapter assembly. The adapter cage 402 may mechanically engage with the riser board 404. In some implementations, the adapter cage 402 may receive the computer components 408 such that the computer components 408 are disposed on the same side of the riser board 402 as one of the expansion slots 410 or 420. In some implementations, the computer components 408 may be disposed on the same side of the riser board 404 such that the computer components 408 prevent the expansion slot on that side of the riser board 404 from engaging with an expansion component, In other words, for example, the computer components 408 may be disposed on the same side of the riser board 404 as the first expansion slot 410 such that the expansion slot 410 cannot engage with an expansion component. In further implementations, the computer components 408 may be disposed on the opposite side of the riser board 404 as the second expansion slot 420, such that neither the adapter cage 402, nor the adapter hoard 406 or computer components 408 impede or prevent the second expansion slot 420 from engaging with an expansion component.

Figure 4B:
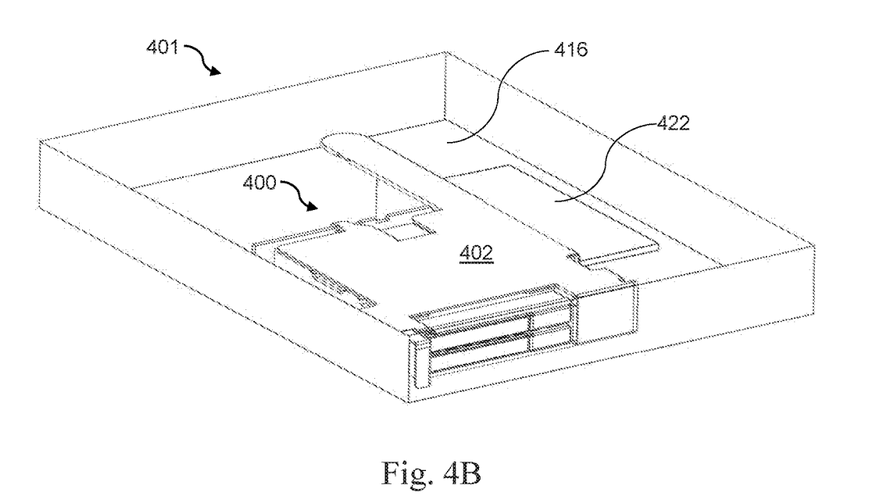
FIG. 4B is a perspective view of a computer system including an example adapter assembly.

Referring additionally to FIG. 4B, the adapter assembly 400 may engage with a computer system 401. The computer system 401 may receive the adapter assembly 400 such that the adapter cage 402, and any engaged computer components 408 are disposed within the computer system 401. In some implementations, the adapter cage 402 may be engaged with the riser board 404 such that the computer components 408 are disposed on the same side as the first expansion slot 410. In further implementations, the adapter cage 402 and the computer components 408 may be disposed on the opposite side as the second expansion slot 420. In such an implementation, the second expansion slot 42.0 may be to engage with an expansion component 422 of the computer system 401 within the computer system 401. The expansion component 422 may be able to engage with the second expansion slot 420 while the adapter cage 402 is engaged with one or more computer components 408.

What is claimed is:

1. An adapter assembly, comprising:
an adapter cage to removably mount to a riser board connected to a system board of a computer system, the riser board including an expansion slot to mate with an expansion component; and
an adapter board that is attached to the adapter cage and includes multiple connectors that are to mate, respectively, with computer components and communicably connect the computer components to the system board of the computer system,
wherein the adapter cage is to receive the multiple computer components such that, when the computer components mate with the connectors of the adapter board, at least one of the computer components occupies at least part of a space that the expansion component would occupy if the expansion component were mated with the expansion slot of the riser board.

2. The adapter assembly of claim 1, wherein the adapter cage is to receive the multiple computer components and align them with the connectors of the adapter board.

3. The adapter assembly of claim 1, wherein the adapter board is attached to the adapter cage such that the adapter board is perpendicular to the riser board when the adapter cage is mounted to the riser board, and the adapter cage is to receive the multiple computer components in a stacked fashion such that the computer components are substantially perpendicular to the riser board and the adapter board.

4. The adapter assembly of claim 1, wherein the computer components are storage drives.

5. The adapter assembly of claim 4, wherein the adapter board and the adapter cage are to allow the storage drives to be inserted and removed from the computer system in a hot-pluggable fashion.

6. The adapter assembly of claim 4, wherein the storage drives are 7 millimeter small form factor (SFF) storage drives.

7. The adapter assembly of claim 1, wherein the computer system is a 1 U height server and the adapter assembly is to fit within the server.

8. The adapter assembly of claim 1, wherein the riser board is to receive power from a system expansion slot that the riser board is mated with and the adapter board is to receive power from the riser board.

9. The adapter assembly of claim 1, wherein the adapter board is positioned in front of the expansion slot of the riser board such that the adaptor board blocks the expansion component from being mated with the expansion slot.

10. The adapter assembly of claim 1, wherein the adapter board is attached to the adapter cage such that the adapter board is perpendicular to the riser board when the adapter cage is mounted to the riser board.

11. The adapter assembly of claim 10, wherein the adapter cage is to slidably receive the multiple computer components, with the computer components being slid along a direction parallel to the riser board.

12. A computer system, comprising:
a system board disposed within the computer system, wherein the system board includes a system expansion slot;
a riser board that is to engage with the system expansion slot of the system board and the riser board includes a riser expansion slot to mate with an expansion component;
an adapter cage to removably mount to the riser board; and
an adapter board that is attached to the adapter cage and includes multiple connectors that are to engage, respectively, with computer components and communicably connect the computer components to the system board, wherein the adapter cage is to receive the computer components such that, when the computer components mate with the connectors of the adapter board, at least one of the computer components blocks the expansion component from mating with the riser expansion slot of the riser board.

13. The computer system of claim 12, wherein the riser board includes a second riser expansion slot disposed on an opposite side of the riser board from the riser expansion slot, wherein the storage drives are located in front of the riser expansion slot on the riser board, and the second riser expansion slot is to engage with a second expansion component of the computer system.

14. The computer system of claim 12, wherein the computer system is a 1 U height server.

15. The computer system of claim 12, wherein the adapter cage is to receive the multiple computer components and align them with the connectors of the adapter board.

16. The computer system of claim 12, wherein the adaptor board is attached to the adapter cage such that the adaptor board is perpendicular to the riser board when the adapter cage is mounted to the riser board, and
the adapter cage is to receive the multiple computer components in a stacked fashion such that the computer components are substantially perpendicular to the riser board and the adapter board.

17. The computer system of claim 12, wherein the computer components are storage drives.

18. The computer system of claim 12,
wherein the riser board is to receive power from the system expansion slot and the adaptor board is to receive power from the riser board.

19. The computer system of claim 12,
wherein the adaptor board is positioned in front of the expansion slot of the riser board such that the adaptor board blocks the expansion component from being mated with the expansion slot.

20. The computer system of claim 12, wherein the adapter board is attached to the adapter cage such that the adapter board is perpendicular to the riser board when the adapter cage is mounted to the riser board.

21. The computer system of claim 12,
wherein the adapter cage is to slidably receive the multiple computer components, with the computer components being slid along a direction parallel to the riser board.

22. A computer system, comprising:
a system board that includes a system expansion slot;
a riser board that is engaged with the system expansion slot of the system board and that includes a riser expansion slot to mate with an expansion component;
an adapter cage removably mounted to the riser board; and
an adapter board that is attached to the adapter cage and includes multiple connectors that are engaged, respectively, with computer components and communicably connect the computer components to the system board,
wherein at least one of the computer components occupies at least part of a space that the expansion component would occupy if the expansion component were mated with the riser expansion slot of the riser board.

23. The computer system of claim 22, wherein the riser board receives power from the system expansion slot and the adapter board receives power from the riser board.

24. The computer system of claim 22, wherein the adaptor board is positioned in front of the expansion slot of the riser board such that the adapter board blocks the expansion component from being mated with the expansion slot.

25. The computer system of claim 22,
wherein the riser board includes a second riser expansion slot disposed on an opposite side of the riser board from the riser expansion slot,
wherein the second riser expansion slot is engaged with a second expansion component.

* * * * *